US012695425B2

(12) United States Patent
Chen et al.

(10) Patent No.: US 12,695,425 B2
(45) Date of Patent: Jul. 28, 2026

(54) SWITCH CONTROL CIRCUIT, MULTIPLEXER SWITCH CIRCUIT AND CONTROL METHOD FOR MULTIPLEXER SWITCH CONTROL CIRCUIT

(71) Applicant: CHIPONE TECHNOLOGY (BEIJING) CO., LTD., Beijing (CN)

(72) Inventors: Feixiang Chen, Beijing (CN); Weijiang Li, Beijing (CN); Zhuo Li, Beijing (CN); Jun Yang, Beijing (CN)

(73) Assignee: Chipone Technology (Beijing) Co., Ltd., Beijing (CN)

( * ) Notice: Subject to any disclaimer, the term of this patent is extended or adjusted under 35 U.S.C. 154(b) by 1068 days.

(21) Appl. No.: 17/781,181

(22) PCT Filed: Dec. 17, 2020

(86) PCT No.: PCT/CN2020/137334
§ 371 (c)(1),
(2) Date: May 31, 2022

(87) PCT Pub. No.: WO2021/143450
PCT Pub. Date: Jul. 22, 2021

(65) Prior Publication Data
US 2023/0006608 A1 Jan. 5, 2023

(30) Foreign Application Priority Data
Jan. 14, 2020 (CN) .......................... 202010039535.5

(51) Int. Cl.
| | |
|---|---|
| *H03F 1/02* | (2006.01) |
| *H03F 3/45* | (2006.01) |
| *H03K 17/687* | (2006.01) |

(52) U.S. Cl.
CPC ....... *H03F 1/0211* (2013.01); *H03F 3/45475* (2013.01); *H03K 17/687* (2013.01); *H03F 2200/129* (2013.01)

(58) Field of Classification Search
CPC .............. H03F 1/0211; H03F 3/45475; H03F 2200/129; H03K 17/687;
(Continued)

(56) References Cited

U.S. PATENT DOCUMENTS

| | | | | |
|---|---|---|---|---|
| 5,856,812 A | * | 1/1999 | Hush ..................... | H01J 31/127 345/77 |
| 6,862,010 B2 | * | 3/2005 | Nicolas .................... | G09G 3/22 323/268 |

(Continued)

FOREIGN PATENT DOCUMENTS

| | | |
|---|---|---|
| CN | 101587753 A | 11/2009 |
| CN | 202435332 U | 9/2012 |

(Continued)

OTHER PUBLICATIONS

English Translation of recited Chinese patent documents.
(Continued)

*Primary Examiner* — Andrea Lindgren Baltzell
*Assistant Examiner* — Khiem D Nguyen
(74) *Attorney, Agent, or Firm* — Hogan Lovells US LLP

(57) ABSTRACT

The present invention discloses a construction method using a 3D printer and a framework member manufacturing apparatus applied to the method. It is characterized by using a construction 3D printer, a print head with an extrusion nozzle moves along three axes according to a 3D design file, extruding material to form an inner framework member; Stacking a predetermined number of the inner framework members to form an inner framework module, thereby establishing a modular inner framework; Connecting mul-
(Continued)

tiple modular inner frameworks in parallel to form an internal structure constituting sidewalls and a ceiling; and covering an external structure onto the exterior of the internal structure and integrating them. Accordingly, this enables the rapid and robust construction of amorphous buildings with complex curves (such as linear, conical, etc.). It enhances durability, significantly reduces manufacturing costs, and achieves the effect of producing buildings with sophisticated shapes.

18 Claims, 6 Drawing Sheets

(58) Field of Classification Search
    CPC ... H03K 2217/0054; H03K 2217/0081; H03K 17/162; H03K 17/693; H02M 3/07; H02M 1/44
    USPC .......................................................... 330/260
    See application file for complete search history.

(56) References Cited

U.S. PATENT DOCUMENTS

| | | | |
|---|---|---|---|
| 2013/0162322 A1 | 6/2013 | Tao et al. | |
| 2017/0090669 A1 | 3/2017 | Paladugu et al. | |

FOREIGN PATENT DOCUMENTS

| | | |
|---|---|---|
| CN | 107015711 A | 8/2017 |
| CN | 109461730 A | 3/2019 |
| CN | 110196653 A | 9/2019 |
| CN | 209913796 U | 1/2020 |
| CN | 111245218 A | 6/2020 |
| KR | 10200180003122 A | 8/2019 |
| WO | 2020003634 A1 | 1/2020 |

OTHER PUBLICATIONS

First Office Action of CN 202010039535.5 dated Sep. 21, 2020 with English Translation.
Second Office Action of CN 202010039535.5 dated Mar. 8, 2021 with English Translation.
Supplementary Search of CN 202010039535.5 (Unknown Date).
Notification to Grant Patent of CN 202010039535.5 dated Aug. 4, 2021 with English Translation.
International Search Report and Written Opinion issued in PCT Application No. PCT/CN2020/137334, dated Mar. 16, 2021 with English Translation.
English Abstract of KR102018003122A.
KR Office Action dated Aug. 4, 2023 from application serial No. KR 10-2022-7005542A.
EP Office Action dated Aug. 23, 2022 from application serial No. EP20913988.0.

* cited by examiner

SWITCH CONTROL CIRCUIT, MULTIPLEXER SWITCH CIRCUIT AND CONTROL METHOD FOR MULTIPLEXER SWITCH CONTROL CIRCUIT

CROSS-REFERENCE TO RELATED APPLICATION

This application is a 371 application of PCT/CN2020/137334 filed on Dec. 17, 2020, which claims priority to Chinese patent application with the filing number 2020100395355 filed on Jan. 14, 2020 with the Chinese Patent Office, and entitled "SWITCH CONTROL CIRCUIT, MULTIPLEXER SWITCH CIRCUIT AND CONTROL METHOD THEREOF", the contents of which are incorporated herein by reference in their entireties.

TECHNICAL FIELD

The present disclosure relates to the field of circuit technology, in particular to a switch control circuit, a multiplexer switch circuit and a control method for multiplexer switch control circuit.

BACKGROUND ART

In an integrated circuit, the switch can be embodied as a Metal-Oxide-Semiconductor Field-Effect Transistor (MOSFET), which is also called a field-effect transistor switch, and control signal thereof is the gate electrode voltage. By inputting a high level or a low level to the gate electrode of the MOSFET, the MOSFET is controlled to be turned on or off.

However, the noise of the gate electrode voltage may be coupled into the circuit where the source and drain electrodes are located, through the parasitic capacitor between the gate electrode and the source electrode of the MOSFET, thereby greatly impairing the signal-to-noise ratio. The gate electrode voltage of the switch is usually connected to the power source or reference ground, therefore, the use of the switches puts forward higher requirements for reducing power source noise.

In order to reduce the power source coupling noise, the existing general method is to use a low dropout regulator (LDO) with a high power source rejection ratio to generate the power source voltage. However, using LDO technology to reduce power source noise may introduce quiescent current and increase power consumption.

SUMMARY

One of the objectives of the present disclosure includes providing a switch control circuit for reducing power source coupling noise and improving signal transmission quality.

In order to achieve the foregoing objectives, the technical solutions adopted in the embodiments of the present disclosure are as follows:

In the first aspect, an embodiment of the present disclosure provides a switch control circuit, comprising:

a first control switch, configured to transmit a power source signal when being turned on;

a first capacitor, wherein the first capacitor is connected to the first control switch, and configured to receive the power source signal for charging and release a charging voltage when the first control switch is turned off; and a field-effect transistor switch, connected to the first capacitor, wherein the field-effect transistor switch is configured to receive the charging voltage released by the first capacitor to control the field-effect transistor switch to be turned on.

In a possible implementation, the switch control circuit further comprises:

a second control switch, connected to the drain electrode of the field-effect transistor switch, and configured to be turned on when the first capacitor is charged and to be turned off when the first capacitor is discharged; and a signal processing circuit, connected in parallel to two ends of the second control switch, wherein the signal processing circuit is configured to process the analog signal transmitted by the field-effect transistor switch when the second control switch is turned off.

In a possible implementation, the first end of the first control switch is configured to receive the power source signal, and the second end of the first control switch is electrically connected to the first end of the first capacitor; the second end of the first capacitor is grounded; and the gate electrode of the field-effect transistor switch is connected to the first end of the first capacitor.

In a possible implementation, the charging voltage released by the first capacitor is greater than the ON voltage drop of the field-effect transistor switch.

In a possible implementation, the signal processing circuit is an analog front end, and the analog front end comprises:

an operational amplifier, wherein the reverse input end of the operational amplifier is connected to the drain electrode of the field-effect transistor switch, and the forward input end of the operational amplifier is configured to receive a reference voltage; and a sampling capacitor, wherein one end of the sampling capacitor is connected to the reverse input end of the operational amplifier, and the other end is connected to the output end of the operational amplifier, wherein the second control switch is connected in parallel to two ends of the sampling capacitor.

In a possible implementation, the field-effect transistor switch comprises one of an NMOS switch, a PMOS switch or a CMOS switch.

In a possible implementation, when the first control switch is turned on and the second control switch is turned on, the signal processing circuit works in the reset state; and when the first control switch is turned off and the second control switch is turned off, the signal processing circuit works in the amplified state.

In the second aspect, an embodiment of the present disclosure also provides a multiplexer switch circuit, comprising:

a switch array, comprising multiple groups of switch control circuits, wherein each group of switch control circuits comprises the switch control circuit provided in the foregoing embodiments of the present disclosure.

In a possible implementation, the multiplexer switch circuit further comprises:

at least one group of the second control switch and the signal processing circuit;

wherein the second control switch is connected to the drain electrode of the field-effect transistor switch in each group of switch control circuits, and configured to be turned on when the first capacitor is charged and turned off when the first capacitor is discharged; and the signal processing circuit is connected in parallel to two ends of the second control switch, and the signal processing circuit is configured to process the analog signal transmitted by the field-effect transistor switch when the second control switch is turned off.

In a possible implementation, the signal processing circuit is an analog front end, and the analog front end comprises:

an operational amplifier, wherein the reverse input end of the operational amplifier is connected to the drain electrode of the field-effect transistor switch in each group of switch control circuits, and the forward input end is configured to receive a reference voltage; and a sampling capacitor, wherein one end of the sampling capacitor is connected to the reverse input end of the operational amplifier, and the other end is connected to the output end of the operational amplifier.

In a possible implementation, the second control switch is connected in parallel to two ends of the sampling capacitor.

In the third aspect, an embodiment of the present disclosure also provides a control method, wherein the method is applied to the multiplexer switch circuit provided in the present disclosure, and the method comprises:

transmitting a power source signal to the first control switch of at least one group of switch control circuits;

controlling the first control switch to be turned on, and charging the first capacitor through the power source signal;

controlling the first control switch to be turned off, after the charging is completed, and using the charging voltage released by the first capacitor to drive the field-effect transistor switch to be turned on.

In a possible implementation, the power source signal is a high level signal, and the method further comprises:

controlling and inputting a low level signal to the first control switch(s) to which no power source signal is input.

In a possible implementation, the multiplexer switch circuit further comprises: at least one group of the second control switch and the signal processing circuit, wherein the second control switch is connected in parallel to the signal processing circuit, and the signal processing circuit is connected to each group of switch control circuits; the method further comprises:

controlling the second control switch to be turned off, when the first control switch is turned off, wherein the analog signal transmitted by the field-effect transistor switch is processed through the signal processing circuit.

In a possible implementation, the control method further comprises:

controlling the second control switch to be turned on, when the first control switch is turned on, wherein the analog signal transmitted by the field-effect transistor switch is output through the second control switch.

In the switch control circuit, the multiplexer switch circuit and the control method for a multiplexer switch control circuit provided by the embodiments of the present disclosure, when the first control switch is turned off, the charging voltage released by the first capacitor can control the field-effect transistor switch to be turned on, at this time, because the first control switch is turned off, the power source signal cannot reach the gate electrode of the field-effect transistor switch, so the power source noise cannot be coupled into the circuit where the source and drain electrodes of the field-effect transistor switch are located, therefore, in the discharge stage of first capacitor, the discharge voltage can be used as a control signal to control the field-effect transistor switch to be turned on, thereby reducing power source coupling noise.

BRIEF DESCRIPTION OF DRAWINGS

In order to illustrate the technical solutions of the embodiments of the present disclosure more clearly, the drawings need to be used in the embodiments of the present disclosure will be briefly introduced below.

DETAILED DESCRIPTION OF EMBODIMENTS

The technical solutions in the embodiments of the present disclosure will be described below in conjunction with the drawings in the embodiments of the present disclosure.

Similar labels and letters represent similar items in the following drawings, therefore, once a certain item is defined in one drawing, it does not need to be further defined and explained in subsequent drawings. At the same time, in the description of the present disclosure, the terms "first", "second" and the like are merely used to distinguish between descriptions, and cannot be understood as indicating or implying importance in relativity.

Figure 1:
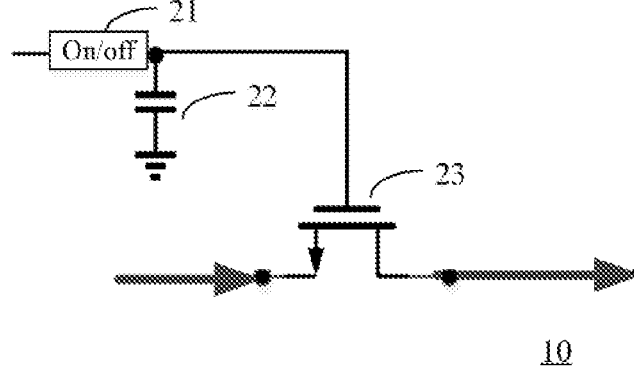
FIG. 1 is a schematic view of a switch control circuit provided by an embodiment of the present disclosure.

FIG. 1 is a schematic view of a switch control circuit 10 provided by an embodiment of the present disclosure; the switch control circuit 10 comprises: a first control switch 21, a first capacitor 22 and a field-effect transistor switch 23.

One end of the first control switch 21 is connected to a signal source, wherein the signal source is configured to output the power source signal VDD to the subsequent circuit when the first control switch 21 is turned on. The first control switch 21 is configured to receive the power source signal, and control the ON-OFF state of the power source signal; the first end of first capacitor 22 is connected to the first end of the first control switch 21, the second end of the first capacitor 22 is grounded, the first capacitor 22 is configured to receive the power source signal VDD for charging, when the first control switch 21 is turned on, and the first capacitor 22 is also configured to release electrical energy when the first control switch 21 is turned off, the gate electrode of the field-effect transistor switch 23 is connected to the first end of the first capacitor 22, optionally, the charging voltage released when the first capacitor 22 is discharged is greater than the ON voltage drop of the field-effect transistor switch 23, and when the first capacitor 22 is discharged, the field-effect transistor switch 23 controls the field-effect transistor switch 23 to be turned on by the charging voltage released by the first capacitor 22.

In a possible implementation, the field-effect transistor switch 23 and the first control switch 21 may be N-Metal-Oxide-Semiconductor (NMOS) switches, Positive channel Metal Oxide Semiconductor (PMOS) switches or Complementary Metal Oxide Semiconductor (CMOS) switches.

In the switch control circuit 10 provided by the foregoing embodiments, when the first control switch 21 is turned off, the first capacitor 22 is converted from a charged state to a discharged state, and the charging voltage released by the first capacitor 22 can control the field-effect transistor switch 23 to be turned on, at this time, since the first control switch 21 is turned off, the power source signal VDD cannot reach the gate electrode of the field-effect transistor switch 23, so the power source noise cannot be coupled into the circuit where the source and drain electrodes of the field-effect transistor switch 23 are located, therefore, when the first capacitor 22 is in discharging phase, the discharge voltage of the first capacitor 22 can be used as a control signal of the field-effect transistor switch 23 to control the field-effect transistor switch 23 to be turned on, thereby reducing the power source coupling noise.

Figure 2:
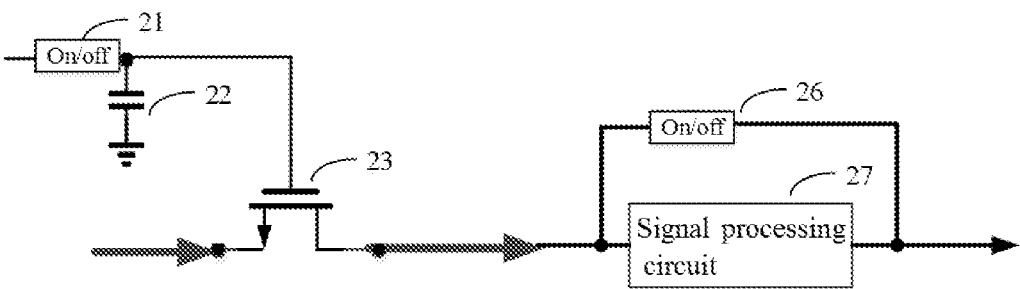
FIG. 2 is a schematic view of another switch control circuit provided by an embodiment of the present disclosure.

As shown in FIG. 2, in a possible implementation, the switch control circuit 10 may further comprise: a second control switch 26 and a signal processing circuit 27. The second control switch 26 is connected to the drain electrode of the field-effect transistor switch 23, and controls the second control switch 26 to be turned on when the first capacitor 22 is charged, and to be turned off when first capacitor 22 is discharged. That is, when the first control switch 21 is turned on, the second control switch 26 is turned on; and when the first control switch 21 is turned off, the second control switch 26 is turned off.

The signal processing circuit 27 is connected in parallel with the second control switch 26, wherein the signal processing circuit 27 is configured to process the input analog signal when the second control switch 26 is turned off.

In a possible implementation, when the first control switch 21 is turned on, the first capacitor 22 is charged, and the field-effect transistor switch 23 is turned on, at this time, in order to prevent power source noise from being coupled into the analog signal received by the signal processing circuit 27, the second control switch 26 is turned on, so that the analog signal is directly output through the second control switch 26 without passing through the signal processing circuit 27.

When the first control switch 21 is turned off, the first capacitor 22 is discharged and the field-effect transistor switch 23 is turned on, at this time, the power source noise may not be coupled into field-effect transistor switch 23, and the second control switch 26 is controlled to be turned off, the analog signal may be processed by the signal processing circuit 27, thereby reducing the noise contained in the analog signal.

Figure 3:
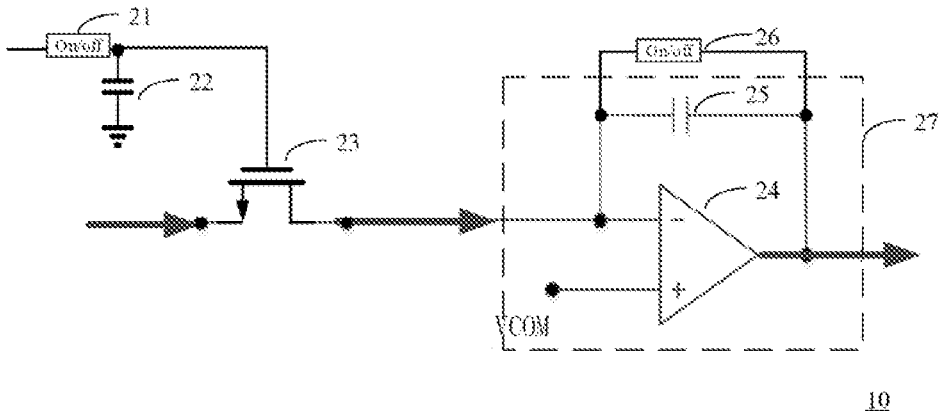
FIG. 3 is a schematic view of another switch control circuit provided by an embodiment of the present disclosure.

In a possible implementation, as shown in FIG. 3, the signal processing circuit 27 may be an analog front end (Analog Front End, AFE). The analog front end may comprise: an operational amplifier 24 and a sampling capacitor 25. The reverse input end of the operational amplifier 24 is connected to the drain electrode of the field-effect transistor switch 23, and the forward input end of the operational amplifier 24 is configured to receive the reference voltage; one end of the sampling capacitor 25 is connected to the reverse input end of the operational amplifier 24, and the other end of the sampling capacitor 25 is connected to the output end of the operational amplifier 24; and the second control switch 26 is connected in parallel to two ends of the sampling capacitor 25.

Figure 4:
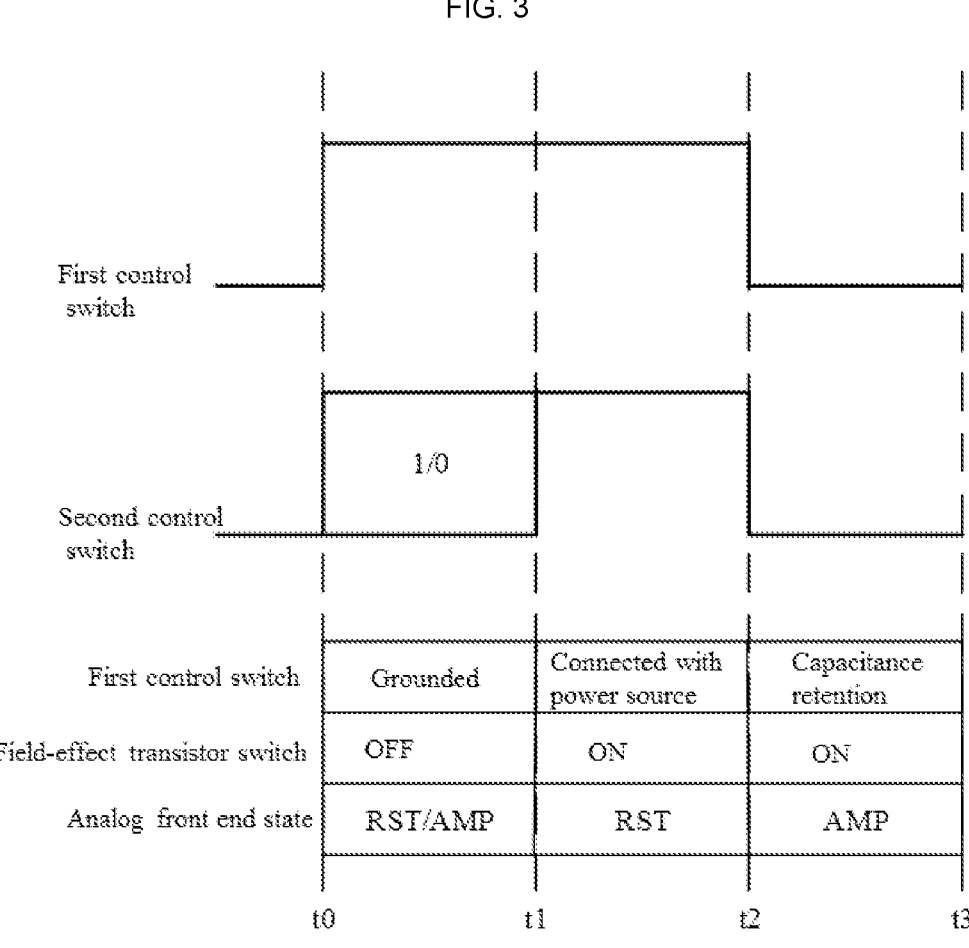
FIG. 4 is a timing schematic view of the ON/OFF conditions and AFE states of different switches in the circuit shown in FIG. 3.

FIG. 4 shows a timing schematic view of the ON and OFF of each switch, and as it may be affected by different factors in actual situations, the ON or OFF of the first control switch 21 and the second control switch 26 may not be completely synchronized, and the slight time difference may be ignored.

Optionally, when the first control switch 21 is turned off and the second control switch 26 is turned off, the signal processing circuit 27 works in an amplified state. When the first control switch 21 is turned on and the second control switch 26 is turned on, the signal processing circuit 27 works in a reset state.

Figure 5:
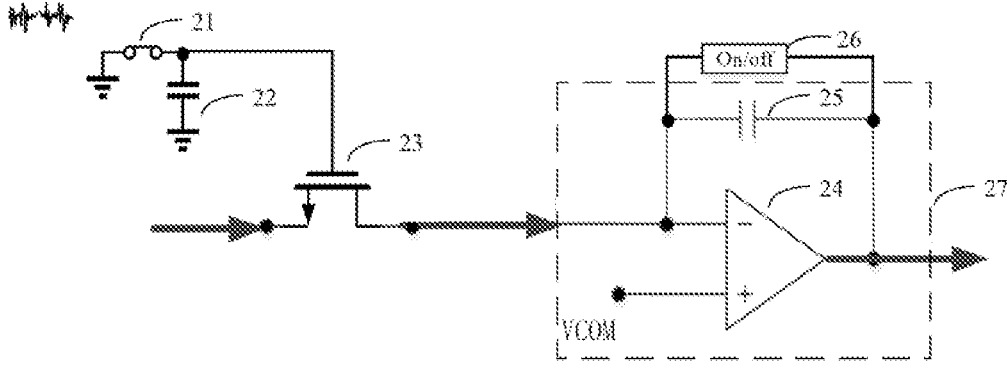
FIG. 5 is a schematic view of the switch control circuit in the time period from t0 to t1 in FIG. 4.

For example, please refer to FIG. 4 and FIG. 5 in combination, FIG. 5 is a state view that matches the ON/OFF conditions and the analog front end states of switches in the circuit shown in the timing view of FIG. 4. Please refer to FIG. 4 and FIG. 5 in combination, during the time period from t0 to t1, the first control switch 21 is ON, the second control switch 26 is ON or OFF. In this interval, gate electrode input signal of the first control switch 21 is at a low level, the source and drain electrodes of the first control switch 21 are turned off (non-conduction), and gate electrode input signal of the field-effect transistor switch 23 is at a low level, the source electrode and drain electrode of the field-effect transistor switch 23 are turned off (non-conduction), so the signal is not transmitted to the signal processing circuit 27. And the signal processing circuit 27 is in a reset (RST) or amplified (AMP) state.

Figure 6:
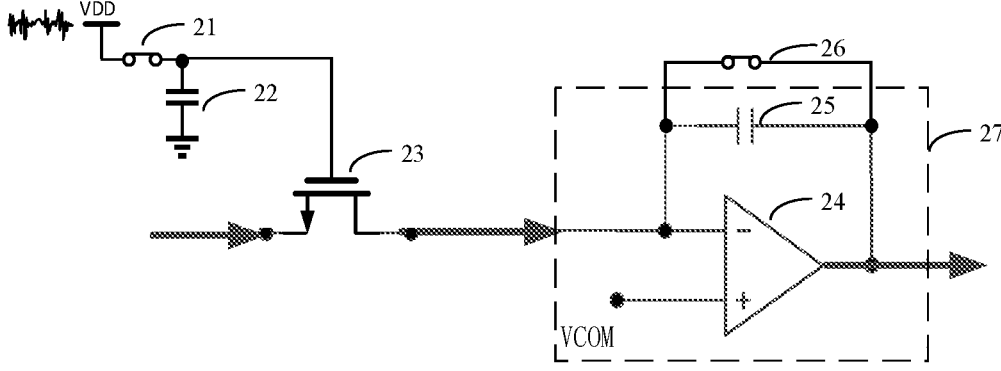
FIG. 6 is a schematic view of the switch control circuit in the time period from t1 to t2 in FIG. 4.

Please refer to FIG. 4 and FIG. 6 in combination, during the time period from t1 to t2, the first control switch 21 receives the power source signal VDD (high level), and the first control switch 21 and the second control switch 26 are both ON. In this interval, the first control switch 21 receives the power source signal VDD, the first capacitor is charged, and the gate electrode input signal of the field-effect transistor switch 23 is at a high level, the source electrode and drain electrode of the field-effect transistor switch 23 are turned on (conduction). Since the second control switch 26 is ON during this time period, the input signal is directly output through the second control switch 26, and may not enter the signal processing circuit 27 for processing. The signal processing circuit 27 is in a reset state.

Figure 7:
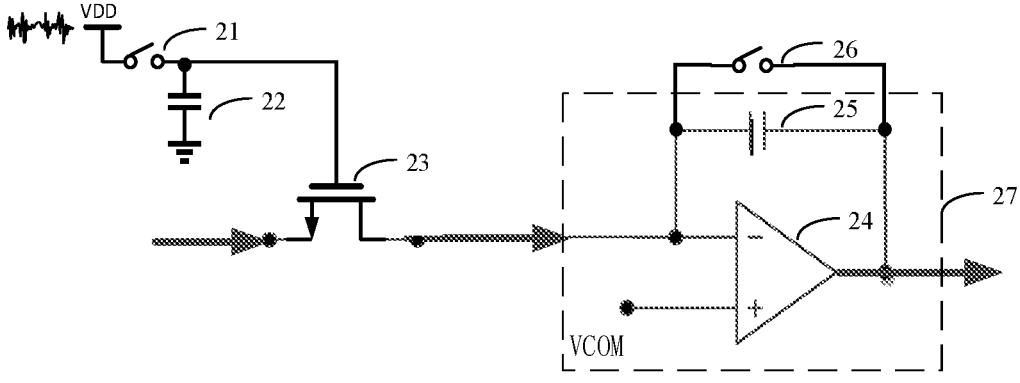
FIG. 7 is a schematic view of the switch control circuit in the time period from t2 to t3 in FIG. 4.

Please refer to FIG. 4 and FIG. 7 in combination. From t2 to t3, the first control switch 21 and the second control switch 26 are both OFF. In this interval, since the first control switch 21 is OFF, the first capacitor 25 releases the voltage, the gate electrode input signal of the field-effect transistor switch 23 is at a high level, so that the source and the drain electrodes of the field-effect transistor switch 23 are turned on (conduction). The input signal enters the signal processing circuit 27 for sampling, and the signal processing circuit 27 works in an amplified state.

Figure 8:
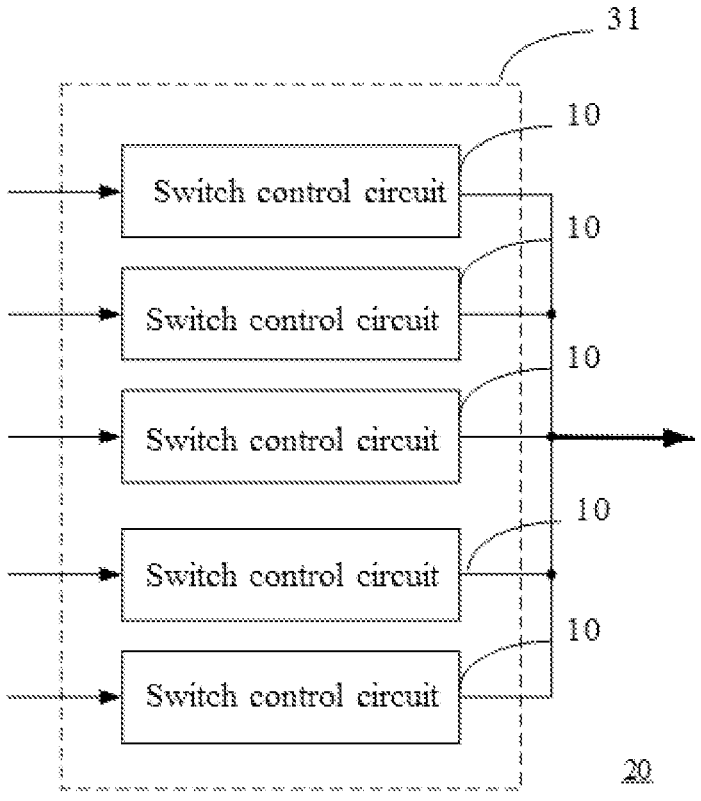
FIG. 8 is a schematic view of a multiplexer switch circuit provided by an embodiment of the present disclosure.

FIG. 8 is structural schematic view of a multiplexer switch circuit 20 provided by the present embodiment. The multiplexer switch circuit 20 comprises a switch array 31, wherein the switch array 31 comprises multiple groups of the switch control circuits 10, and the multiple groups of the switch control circuits 10 are connected in parallel. In the present embodiment, the switch array 31 comprising 5 groups of switch control circuits 10 is taken as an example, and this application is not limited to this. The structure of each group of switch control circuits 10 can be as shown in FIG. 1, and may not be repeated here.

In a possible implementation, if it is necessary to select the first group of switch control circuits 10 to be turned on, the power source signals of the first group of switch control circuits 10 may be controlled to be at a high level, and the power source signals of other groups of switch control circuits are at a low level, so that only the first capacitor 22 of the first group of switch control circuits 10 is charged, therefore, in the discharging phase of the first capacitor 22, only the field-effect transistor switch 23 of the first group of switch control circuits 10 may be turned on, and only one line may be selected for signal transmission.

Figure 9:
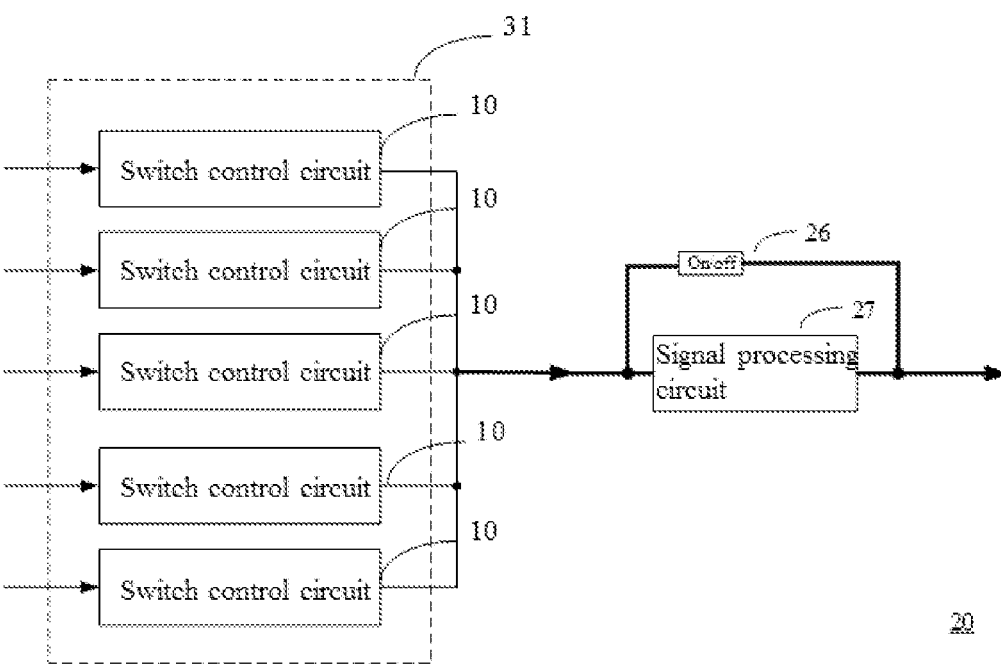
FIG. 9 is a schematic view of another multiplexer switch circuit provided by an embodiment of the present disclosure.

In a possible implementation, as shown in FIG. 9, the multiplexer switch circuit 20 may further comprise: a second control switch 26 and a signal processing circuit 27, wherein the second control switch 26 is connected to the drain electrode of the field-effect transistor switch 23 in each group of switch control circuits 10, and configured to be turned on when the first capacitor 22 of the switch control circuit 10 is charged, and to be turned off when the first capacitor 22 is discharged.

The signal processing circuit 27 is connected in parallel with the second control switch 26, wherein the signal processing circuit 27 is configured to process, in the case that the second control switch 26 is OFF, the analog signal transmitted by the field-effect transistor switch 23 in the switch control circuit 10.

Figure 10:
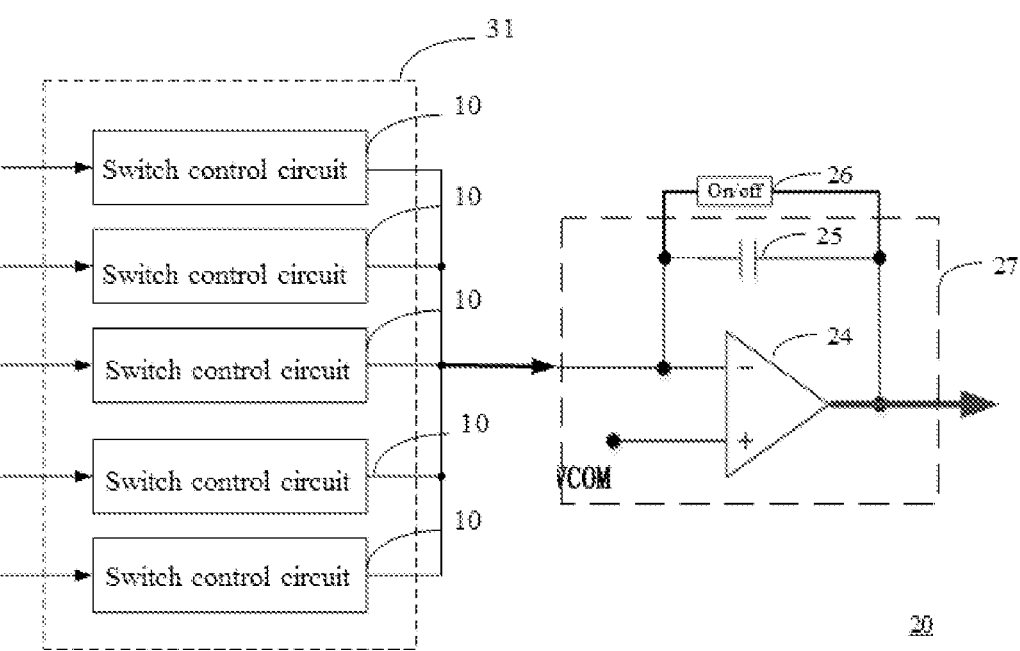
FIG. 10 is a schematic view of another multiplexer switch circuit provided by an embodiment of the present disclosure.

In a possible implementation, as shown in FIG. 10, the signal processing circuit 27 comprises: an operational amplifier 24 and a sampling capacitor 25, wherein the reverse input end of the operational amplifier 24 is connected to the drain electrode of the field-effect transistor switch 23 in each group of switch control circuits 10, and the forward input end of the operational amplifier 24 is configured to input the reference voltage; and one end of the sampling capacitor 25 is connected to the reverse input end of the operational amplifier 24, and the other end of the sampling capacitor 25 is connected to the output end of the operational amplifier 24; wherein the second control switch 26 is connected in parallel to two ends of the sampling capacitor 25.

Figure 11:
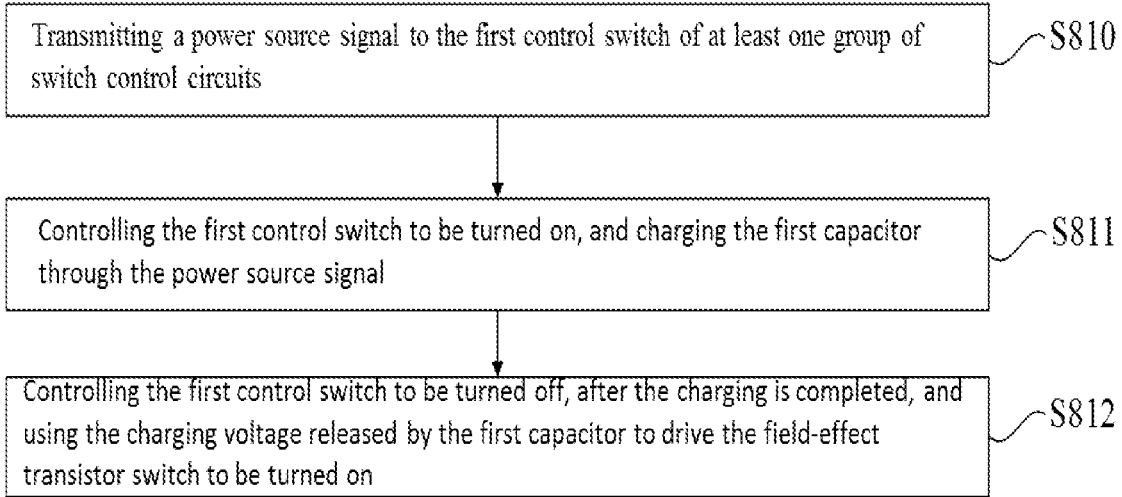
FIG. 11 is a flowchart of a control method for the multiplexer switch circuit provided by an embodiment of the present disclosure.

FIG. 11 is a flowchart schematic view of a control method provided by an embodiment of the present disclosure. This method may be applied to the multiplexer switch circuit described in the foregoing embodiments. The method may comprise the following steps.

Step 810: transmitting a power source signal to the first control switch of at least one group of switch control circuits.

In a possible implementation, the high level signal of the power source is transmitted to the first control switch of one group of switch control circuits, and the low level signal is transmitted to the first control switch of the other groups of switch control circuits.

Step 811: controlling the first control switch to be turned on, and charging the first capacitor through the power source signal.

In a possible implementation, the multiplexer switch circuit further comprises: at least one group of second control switch and signal processing circuit, wherein the second control switch is connected in parallel to the signal processing circuit, and the signal processing circuit is connected to each group of switch control circuits; therefore, in the case that the first control switch is ON the second control switch may also be controlled to be turned on, so that the analog signal transmitted by the field-effect transistor switch is output through the second control switch.

Step 812: controlling the first control switch to be turned off, after the charging is completed, and using the charging voltage released by the first capacitor to drive the field-effect transistor switch to be turned on.

In a possible implementation, the second control switch may be controlled to be turned off, when the first control switch is turned off, such that the analog signal transmitted by the field-effect transistor switch is processed through the signal processing circuit.

INDUSTRIAL APPLICABILITY

In the switch control circuit, the multiplexer switch circuit and the control method for a multiplexer switch control circuit provided by the embodiments of the present disclosure, when the first control switch is turned off, the charging voltage released by the first capacitor can control the field-effect transistor switch to be turned on, at this time, because the first control switch is turned off, the power source signal cannot reach the gate electrode of the field-effect transistor switch, so the power source noise cannot be coupled into the circuit where the source and drain electrodes of the field-effect transistor switch are located, therefore, in the discharge stage of first capacitor, the discharge voltage can be used as a control signal to control the field-effect transistor switch to be turned on, thereby reducing power source coupling noise.

What is claimed is:

1. A switch control circuit, comprising:
   a first control switch, configured to transmit a power source signal when being turned on;
   a first capacitor, wherein the first capacitor is connected to the first control switch, and configured to receive the power source signal for charging, and to release a charging voltage when the first control switch is turned off;
   a field-effect transistor switch, connected to the first capacitor, wherein the field-effect transistor switch is configured to receive the charging voltage released by the first capacitor to control the field-effect transistor switch to be turned on;
   a second control switch, connected to a drain electrode of the field-effect transistor switch, and configured to be turned on when the first capacitor is charged, and turned off when the first capacity is discharged; and
   a signal processing circuit, connected in parallel to two ends of the second control switch, wherein the signal processing circuit is configured to process, when the second control switch is turned off, an analog signal transmitted by the field-effect transistor switch.

2. The switch control circuit according to claim 1, wherein a first end of the first control switch is configured to receive the power source signal, and a second end of the first control switch is electrically connected to a first end of the first capacitor;
   a second end of the first capacitor is grounded; and
   a gate electrode of the field-effect transistor switch is connected to the first end of the first capacitor.

3. The switch control circuit according to claim 1, wherein the charging voltage released by the first capacitor is greater than an ON voltage drop of the field-effect transistor switch.

4. The switch control circuit according to claim 1, wherein the signal processing circuit is an analog front end, and the analog front end comprises:
   an operational amplifier, wherein a reverse input end of the operational amplifier is connected to the drain electrode of the field-effect transistor switch, and a forward input end of the operational amplifier is configured to receive a reference voltage; and a sampling capacitor, wherein one end of the sampling capacitor is connected to the reverse input end of the operational amplifier, and the other end is connected to an output end of the operational amplifier, wherein the second control switch is connected in parallel to two ends of the sampling capacitor.

5. The switch control circuit according to claim 1 wherein the field-effect transistor switch comprises one of an NMOS switch, a PMOS switch or a CMOS switch.

6. The switch control circuit according to claim 4, wherein a working state of the signal processing circuit comprises a reset state and an amplified state;

when the first control switch is turned on and the second control switch is turned on, the signal processing circuit works in the reset state; and when the first control switch is turned off and the second control switch is turned off, the signal processing circuit works in the amplified state.

7. A multiplexer switch circuit, comprising:

a switch array, comprising multiple groups of switch control circuits, wherein each group of switch control circuits comprises a switch control circuit comprising:

a first control switch, configured to transmit a power source signal when being turned on, a first capacitor, wherein the first capacitor is connected to the first control switch, and configured to receive the power source signal for charging, and to release a charging voltage when the first control switch is turned off; and a field-effect transistor switch, connected to the first capacitor, wherein the field-effect transistor switch is configured to receive the charging voltage released by the first capacitor to control the field-effect transistor switch to be turned on.

8. The multiplexer switch circuit according to claim 7, further comprising:

at least one group of a second control switch and a signal processing circuit, wherein the second control switches is connected to a drain electrode of the field-effect transistor switch in each group of switch control circuits, and configured to be turned on when the first capacitor is charged, and turned off when the first capacitor is discharged; and the signal processing circuit is connected in parallel to two ends of the second control switch, and the signal processing circuit is configured to process, when the second control switch is turned off, an analog signal transmitted by the field-effect transistor switch.

9. The multiplexer switch circuit according to claim 8, wherein the signal processing circuit is an analog front end, and the analog front end comprises:

an operational amplifier, wherein an reverse input end of the operational amplifier is connected to the drain electrode of the field-effect transistor switch in each group of switch control circuits, and a forward input end is configured to receive a reference voltage; and a sampling capacitor, wherein one end of the sampling capacitor is connected to the reverse input end of the operational amplifier, and the other end is connected to an output end of the operational amplifier.

10. The multiplexer switch circuit according to claim 9, wherein the second control switch is connected in parallel to two ends of the sampling capacitor.

11. A control method, wherein the method is applicable to the multiplexer switch circuit according to claim 7 and the method comprises:

transmitting a power source signal to the first control switch of at least one group of switch control circuits;

controlling the first control switch to be turned on, and charging the first capacitor through the power source signal; and controlling the first control switch to be turned off, after the charging is completed, and using a charging voltage released by the first capacitor to drive the field-effect transistor switch to be turned on.

12. The control method according to claim 11, wherein the power source signal is a high level signal, and the method further comprises:

controlling and inputting a low level signal to the first control switch(s) to which no power source signal is input.

13. The control method according to claim 11, wherein the multiplexer switch circuit further comprises: at least one group of a second control switch and a signal processing circuit, wherein the second control switch is connected in parallel to the signal processing circuit, and the signal processing circuit is connected to each group of switch control circuits; and the method further comprises:

controlling the second control switch to be turned off, when the first control switch is turned off, wherein an analog signal transmitted by the field-effect transistor switch is processed through the signal processing circuit.

14. The control method according to claim 13, further comprising:

controlling the second control switch to be turned on, when the first control switch is turned on, wherein the analog signal transmitted by the field-effect transistor switch is output through the second control switch.

15. The switch control circuit according to claim 2, wherein the field-effect transistor switch comprises one of an NMOS switch, a PMOS switch or a CMOS switch.

16. The switch control circuit according to claim 3, wherein the field-effect transistor switch comprises one of an NMOS switch, a PMOS switch or a CMOS switch.

17. The switch control circuit according to claim 4, wherein the field-effect transistor switch comprises one of an NMOS switch, a PMOS switch or a CMOS switch.

18. The multiplexer switch circuit according to claim 9, wherein a working state of the signal processing circuit comprises a reset state and an amplified state;

when the first control switch is turned on and the second control switch is turned on, the signal processing circuit works in the reset state; and when the first control switch is turned off and the second control switch is turned off, the signal processing circuit works in the amplified state.

* * * * *